United States Patent [19]

Fujii

[11] Patent Number: 5,635,884
[45] Date of Patent: Jun. 3, 1997

[54] GROUNDED INDUCTANCE CIRCUIT USING GYRATOR CIRCUIT

[75] Inventor: Tomohiro Fujii, Tokyo, Japan

[73] Assignee: NEC Corporation, Tokyo, Japan

[21] Appl. No.: 660,175

[22] Filed: Jun. 3, 1996

[30] Foreign Application Priority Data

Jun. 3, 1995 [JP] Japan ..................... 7-159868

[51] Int. Cl.$^6$ ..................... H03H 11/50
[52] U.S. Cl. ..................... 333/215; 331/117 R; 331/176
[58] Field of Search ..................... 333/213–215; 331/117 R, 176

[56] References Cited

U.S. PATENT DOCUMENTS 5,117,205 5/1992 Nauta ..................... 333/214 X

FOREIGN PATENT DOCUMENTS 0716506 6/1996 European Pat. Off. .
1-208011 8/1989 Japan .
5-75382 3/1993 Japan .

OTHER PUBLICATIONS

D.W.H. Calder, "Audio Frequency Gyrator Filters For An Integrated Radio Paging Receiver", *Mobile Radio Systems and Techniques*, Sep. 10–13, 1984, pp. 21–26.
Patent Abstracts of Japan, vol. 17, No. 401 (E–1404), Jul. 27, 1993.
Tanimoto et al., "Realization of a 1–V Active Filter Using . . . Plurality of Emitter–Coupled Pairs", *IEEE Journal of Solid–State Circuits*, vol. 26, No. 7, Jul. 1, 1991, pp. 937–944.

*Primary Examiner*—Paul Gensler
*Attorney, Agent, or Firm*—Sughrue, Mion, Zinn, Macpeak & Seas

[57] ABSTRACT

The grounded inductance circuit utilizing a gyrator circuit includes a first operational transconductance amplifier, a second operational transconductance amplifier and a first capacitor. A first output terminal of the first operational transconductance amplifier is connected to a first input terminal of the second operational transconductance amplifier, and a second output terminal of the first operational transconductance amplifier is connected to a second input terminal of the second operational transconductance amplifier. A first output terminal of the second operational transconductance amplifier is connected to a second input terminal of the first operational transconductance amplifier and a second output terminal of the second operational transconductance amplifier is connected to a first input terminal of the first operational transconductance amplifier. The second input terminal of the first operational transconductance amplifier and the first input terminal of the second operational transconductance amplifier are connected to each other and the junction of the two input terminals is applied with a predetermined dc bias voltage with respect to the ground potential. The capacitor is connected between the junction and the second input terminal of the second operational transconductance amplifier. An ac signal is applied between the first input terminal of the first operational transconductance amplifier and the ground potential.

4 Claims, 5 Drawing Sheets

GROUNDED INDUCTANCE CIRCUIT USING GYRATOR CIRCUIT

BACKGROUND OF THE INVENTION

The present invention relates to a grounded inductance circuit and an LC resonance circuit utilizing a gyrator circuit and specifically relates to an LC resonance circuit frequency-stabilized against a temperature change.

In the fields of electronic circuits including ICs, a variety of attempts have been made recently to incorporate into an IC electronic parts which have been arranged conventionally on the periphery of the IC.

In particular, it has been presumed as advantageous to provide an inductance element in the interior of the IC, because a major area of the LC resonance circuit is occupied by the inductance element and because a degree of freedom to specify the characteristic of the inductance element is limited.

As a method of providing an inductance in an interior of an IC, the method has been reported in which an ac-equivalent inductance is formed utilizing a gyrator circuit.

FIG. 1 represents a circuit diagram to illustrate the principle of a conventional gyrator circuit.

As is shown in the figure, the gyrator circuit is made up of first and second operational transconductance amplifiers, OTA 1 and OTA 2 with the differential output terminals C,D of OTA 1 connected to the differential input terminals S,T of OTA 2, respectively, and with the differential output terminals E,F of OTA 2 cross-connected to the differential input terminals B, A of OTA 1, respectively. In addition, a capacitor $C_1$ is connected between the differential output terminals C, D of OTA 1.

FIG. 2 is a block diagram of an ac-equivalent circuit of the gyrator circuit shown in FIG. 1.

In FIG. 1 and FIG. 2, I' and V' denote ac components of a current I and a voltage V, respectively.

The ac current $I_1'$ flows through the current path in OTA 2 the conductance of which is controlled by the base voltage $V_2'$ of OTA 2 produced across capacitor $C_1$.

Accordingly, it follows that $$I_1' = G_2 V_2', \qquad (1)$$

wherein $G_2$ stands for the transconductance of OTA 2. Similarly, $$-I_2' = G_1 V_1', \qquad (2)$$

wherein $G_1$ stands for the transconductance of OTA 1.

Substituting $V_2'$ with $-I_2'/(jC_1\omega)$ and eliminating $I_2'$ from equations (1) and (2) yield $$V_1'/I_1' = j\omega[C_1/(G_1 G_2)] \qquad (3)$$

Putting $$L = C_1/(G_1 G_2) \qquad (4)$$

gives $$z_{input} = V_1/I_1 \qquad (5)$$
$$= jL\omega.$$

If the transconductance of OTA 1 equals the transconductance of OTA 2, i.e., $G_1 = G_2$, then $$L = C_1 R_g^2, \qquad (6)$$

wherein $R_g$ denotes the impedance of each of the OTAs.

FIG. 3 is a circuit diagram of an OTA practically used in a gyrator circuit.

As is shown in the figure, each of the differential inputs is connected to the bases of a couple of NPN transistors (Q1,Q2), (Q3,Q4), wherein transistors Q1 and Q4 make up a differential amplifier and transistors Q2 and Q3 make up another differential amplifier.

In FIG. 3, the symbol xn stands for an emitter area n times as large as the emitter area of the transistor not affixed with the symbol. The transistors not affixed with the symbol have the same emitter area as each other. The preferable value of n is 4.

The constant current source denoted by S3 supplies a carrier of $I_g$ to the emitters of transistors Q1,Q4 of the first differential amplifier, and the constant current source S4 supplies carrier of the same intensity $I_g$ to the emitters of transistors Q2,Q3 of the second differential amplifier. Through current loads L1 and L2 constant currents of the same intensity $I_g$ flow.

This circuit structure of the OTA is intended to extend the dynamic range of the OTA.

Now, let collector currents of transistors Q1, Q2, Q3 and Q4 be $I_1$, $I_2$, $I_3$ and $I_4$ respectively.

Then, $$I_1 + I_2 = I_g + I_o, \qquad (7)$$

$$I_3 + I_4 = I_g - I_o, \qquad (7')$$

$$I_g = I_1 + I_4, \qquad (8)$$
$$= I_2 + I_3, \qquad (8')$$

$$I_1 = n \cdot I_s \exp[V_{BE1}/V_T], \qquad (9)$$

$$I_2 = I_s \exp[V_{BE2}/V_T], \qquad (9')$$

$$I_3 = n \cdot I_s \exp[V_{BE3}/V_T], \qquad (10)$$

$$I_4 = n \cdot I_s \exp[V_{BE4}/V_T], \qquad (10')$$

Thus, $$I_1/I_4 = n \cdot \exp[V_d/V_T], \qquad (11)$$

$$I_2/I_3 = n^{-1} \cdot \exp[V_d/V_T], \qquad (11')$$

wherein $V_d$ represents the differential input voltage, $V_{BE1}$ and $V_{BE2}$, $V_{BE3}$ and $V_{BE4}$ representing the base-emitter voltages of transistors Q1, Q2, Q3 and Q4 respectively, $I_s$ denoting the reverse saturation current, and $V_T$ denoting the thermal voltage, i.e., kT/q.

Eliminating the variables except for $I_o$, $I_g$ and $V_d$ from equations (7) to (11') leads to the equation $$I_o = \left[ \frac{1}{1 + n^{-1}\exp(-V_d/V_T)} + \frac{1}{1 + n\exp(-V_d/V_T)} - 1 \right] \cdot I_g \qquad (12)$$

Now, we express equation (12) in power series of $V_d$ and ignore the higher order terms. Then, $$I_o = [I_o]_{V_d=0} + [\delta I_o/\delta V_d]_{V_d=0} V_d. \qquad (13)$$

Since $[\delta I_o/\delta V_d]_{V_d=0}$ is a transconductance G by definition, and $[I_o]_{V_d=0} = 0$, it follows that $$I_o = G V_d, \qquad (14)$$

wherein $$G = [n/(1+n)^2] \cdot (I_g/V_T) \qquad (15)$$

The above argument holds in each of the two OTAs which make up a gyrator circuit.

FIG. 4 is a circuit diagram of a resonance circuit utilizing the gyrator circuit made up of OTAs as shown in FIG. 3.

Like the gyrator circuit illustrated in FIG. 1, a first output terminal C and a second output terminal D of OTA 1 are connected to the first input terminal connected to the bases of the transistors Q13 and Q14 and the second input terminal connected to the bases of the transistors Q15 and Q16, respectively, of OTA 2, while a first output terminal E and a second output terminal F of OTA 2 are connected to the second input terminal connected to the bases of transistors Q7 and Q8 and the first input terminal connected to the bases of transistors Q5 and Q6, respectively, of OTA 1. In addition, a stabilized dc voltage VS1 is applied between the second input terminal Q of OTA 1 and the ground potential in order to effect ac-grounding of one end of the gyrator inductance, causing the first output terminal E of OTA2 to be kept at a constant voltage VS1.

In the figure, the symbol x4 represents a transistor having an emitter area four times as large as the emitter area of a transistor not affixed with the symbol, as described above.

A capacitor C3 for parallel resonance is connected between an ac signal source and the ground potential. Another capacitor C2 for series resonance is connected between the signal source and the input terminal of OTA 1 through resistor R1. The resistor R1 is provided to lower the Q of the resonance circuit.

A stabilized current supply SCS is provided for supplying constant currents $I_g$ through current mirror circuits to the current sources made of NPN transistors Q9, Q10 of OTA 1 and NPN transistors Q17, Q18 of OTA2, and for supplying constant currents $I_g$ to the PNP load transistors Q11, Q12 of OTA1 and Q19, Q20 of OTA2.

The stabilized current supply is made up of serially connected PNP and NPN transistors, Q3, Q1, respectively, serially connected PNP and NPN transistors, Q4, Q2, respectively, dc voltage source VS2, and a current-regulating register R2.

The emitter of transistor Q3 is connected to a positive electrode of dc voltage source VS2, and the emitter of transistor Q1 is connected to the grounded negative electrode of the dc voltage source VS2, thereby making up a current generating circuit. Transistor Q1 is diode connected, the base of which is connected to the base of transistor Q2 to constitute a current mirror circuit.

The serially connected transistors Q2 and Q4 make up an output circuit of the current mirror circuit with the diode-connected transistor Q4 acting as a load transistor. The collector of the load transistor Q4 is connected to the base of the transistor Q3 to form a negative-feedback signal path to stabilize the current $I_c$ flowing through the collectors of transistors Q2 and Q4. The current intensity is determined depending on the value of the resistor R2.

The base line connected with the bases of transistor Q1 and Q2 is connected to the bases of transistors Q9, Q10, Q17 and Q18 to form a current mirror circuit to transfer the current to the current-source transistors (Q9, Q10, Q17, Q18) of OTA 1 and OTA 2.

The base line connected with the bases of transistors Q3 and Q4 is connected to the bases of the transistors Q11, Q12, Q19 and Q20 to form another current mirror circuit for transferring the current to the current load transistors (Q11, Q12, Q19, Q20) of OTA 1 and OTA 2.

The operation of the gyrator circuit shown in FIG. 4 will next be described.

As described in equation (14), the output current of OTA 1 and OTA 2 are given by $$I_{o1}=G_1V_{d1}, \quad (16)$$

$$I_{o2}=G_2V_{d2}, \quad (17)$$

wherein the suffixes 1 and 2 refer to quantities relating to OTA 1 and OTA 2, respectively, and $$V_{d1}=V_p-V_q, \quad (18)$$

$$V_{d2}=V_r-V_s, \quad (19)$$

$V_p$ and $V_q$ denoting electric potentials at the first and second input terminals P and Q, respectively, of OTA 1, and $V_r$ and $V_s$ denoting electric potentials at the first and second input terminals R and S, respectively, of OTA 2.

It is to be noted that the positive sign of the output current $I_o$ corresponds to the direction of the current which flows toward the first output terminal from the second output terminal, as described in FIG. 3.

Let the impedance of the capacitor C1 be z, then $$\begin{aligned} V_{d2} &= (I_{o1} \cdot z) \\ &= G_1 V_{d1} \cdot z. \end{aligned} \quad (20)$$

Substituting equation (20) into equation (17) yields $$I_{o2}=G_1G_2z\cdot V_{d1}. \quad (21)$$

In case that $z=1/(jC\omega)$, $$\begin{aligned} z_{in} &= V_{d1}/I_{o2} \\ &= jC\omega/(G_1G_2), \end{aligned} \quad (22)$$

which agrees with equation (3).

FIG. 5 represents a temperature dependence of the input impedance of the gyrator circuit shown in FIG. 4 plotted against frequency.

The figure shows that the temperature variation from −10° C. to 50° C. causes a shift of the impedance characteristic by 30K Hz, i.e., ±15 KHz with respect to the center frequency of 450 KHz.

This undesirable shift of the input impedance entails a fluctuation of the resonance frequency by ±15 KHz for the same temperature variation.

The frequency variation versus a temperature variation of an ordinary resonance circuit in which a ceramic element is employed as a capacitor element is approximately ±1.5 KHz for the above-described range of temperature variation.

For this reason, the temperature dependence of the resonance circuit utilizing the prior art gyrator circuit is ten times as large as that of an ordinary resonance circuit.

In FIG. 4, main dc biases are entered which are simulated by means of the circuit simulator of Spice et al. The simulation was implemented under the following conditions: temperature 25° C.; series resonance frequency 410 KHz; parallel resonance frequency 490 KHz; center frequency 450 KHz; input impedance 11 KΩ at 450 KHz; tension of dc voltage source VS2 1.05 V; and ac ground potential 860 mV. In addition, the simulation is performed assuming that the temperature characteristics of the dc voltage source VS2 and the ac ground potential are the same as the temperature characteristic of $V_{BE}$ of transistors used in order to take the temperature characteristic of the $V_{BE}$ of the transistor out of consideration.

From the result of the simulation above, it is known that the biases of input and output terminals of the OTAs significantly deviate from their normal values, causing the transistors to saturate and thereby interrupting the transistors normally to work. Furthermore, it is known that the phase of the input impedance of the resonance circuit of FIG. 4 is approximately 37 degrees in contrast to the normal value of 90 degrees.

It is an object of the present invention to provide a grounded inductance circuit and LC resonance circuit utilizing a gyrator circuit of a stable frequency characteristic, in which the dc biases will not deviate from the normal values and the series and parallel resonance frequencies will not be influenced by a temperature variation.

SUMMARY OF THE INVENTION

The object of the present invention can be attained by the grounded inductance circuit utilizing a gyrator circuit, including a first operational transconductance amplifier, a second operational transconductance amplifier, and a first capacitor, a first output terminal of the first operational transconductance amplifier being connected to a first input terminal of the second operational transconductance amplifier, a second output terminal of the first operational transconductance amplifier being connected to a second input terminal of the second operational transconductance amplifier, a first output terminal of said second operational transconductance amplifier being connected to a second input terminal of the first operational transconductance amplifier, a second output terminal of the second operational transconductance amplifier being connected to a first input terminal of the first operational transconductance amplifier, the second input terminal of the first operational transconductance amplifier and the first input terminal of the second operational transconductance amplifier being connected to each other, and the junction of the two input terminals being applied with a predetermined dc bias voltage with respect to the ground potential, said first capacitor being connected between said junction and said second input terminal of said second operational transconductance amplifier, and an ac signal voltage being applied between said first input terminal of said first operational transconductance amplifier and the ground potential.

Since the same dc potential is applied to both of the second input terminal of the first operational transconductance amplifier (hereinafter, referred to as OTA1) and the first input terminal of the second operational transconductance amplifier (hereinafter, referred to as OTA2) in this circuitry, and accordingly since the same dc potential is applied to the first output terminals of the OTA 1 and OTA 2, the two OTAs operate similarly, whereby the situation can be avoided in which one of the two OTAs is placed in a saturated state.

For the reason described above, the transconductances of the two OTAs $G_1$ and $G_2$ according to the present invention become equal. By putting $G_1=G_2$ in equation (22), we have $$z_{in} = V_{d1}/I_{o2} \qquad (22')$$
$$= jC\omega/G^2,$$

Each of the operational transconductance amplifier preferably has at least one differential amplifier with gain transistors of a first conduction type the emitters of which are connected together to a collector of a current-source transistor of the first conduction type, the collectors of said gain transistors being connected to individual load transistors of the second conduction type, said grounded inductance circuit further includes: a stabilized current supply for providing a constant current to said current-source transistors of said operational transconductance amplifiers; a transfer circuit for transferring said constant current provided by said stabilized current supply to said current-source transistors of said operational transconductance amplifiers through a current mirror circuit, said stabilized current supply comprising; a first transistor of said first conduction type and a second transistor of the second conduction type serially connected to said first transistor; and a third transistor of said first conduction type and a fourth transistor of said second conduction type serially connected to said third transistor, the emitter of said third transistor being connected to one end of a current-regulating resistor, the resistance of the resistor being determined so that an arbitrarily selected one of the operational transconductance amplifiers has an optimum transconductance for realizing an intended inductance of the gyrator circuit; and said transfer circuit comprising a fifth transistor of said first conduction type and sixth transistor of said second conduction type serially connected to said fifth transistor, wherein said first transistor is diode-connected, the base of the diode-connected first transistor being connected to the base of said third transistor; said fourth transistor is diode-connected, the base of the diode-connected fourth transistor being connected to the base of said second transistor; the base of the sixth transistor is connected to the base of said fourth transistor; said fifth transistor is diode-connected, the base of the fifth transistor being connected to the bases of said current-source transistors of said operational transconductance amplifiers; and the emitters of said first, fifth transistors and the other end of said resistor are connected to the grounded electrode of an operating dc voltage source and emitters of said second, fourth and sixth transistors are connected to the other electrode of said operating dc voltage source.

While the stabilized current supply described above is a known circuit, it is capable of stabilizing the transconductance G of each of the OTAs against a temperature variation for the reason described below.

Suppose that the ratio of the emitter area of the third transistor (the emitter of which the regulating resistor R is connected) to the emitter areas of the current-source transistors of the OTAs be m and the output current of the stabilized current supply be $I_g$. Then $I_g$ is given as follows:

$$I_g=(V_T/R) \cdot m^{-1}\ln m. \qquad (23)$$

Accordingly, $$(1/I_g)(\delta I_g/\delta T)=(1/V_T)(\delta V_T/\delta T). \qquad (24)$$

On the other hand, from equation (15) it follows that $$(1/G)(\delta G/\delta T)=(1/I_g)(\delta I_g/\delta T)-(1/V_T)(\delta V_T/\delta T) \qquad (25)$$

Substituting equation (24) into equation (25) yields $$\delta G/\delta T=0, \qquad (26)$$

representing that thermal variations of the transconductances in both of the OTAs is compensated for at the same time by taking advantage of the stabilized current supply.

It is to be noted that, since the two OTAs have the same transconductance in the present invention, the thermal variations of the transconductances of the two OTAs can be compensated for at the same time by a single stabilized current supply. It is not the case in the prior art gyrator circuit as shown in FIG. 4, because the two OTAs have different transconductances.

The above and other objects, features and advantages of the present invention will become apparent from the following description referring to the accompanying drawings which illustrate an example of a preferred embodiment of the present invention.

DETAILED EXPLANATION OF PREFERRED EMBODIMENT

Figure 6:
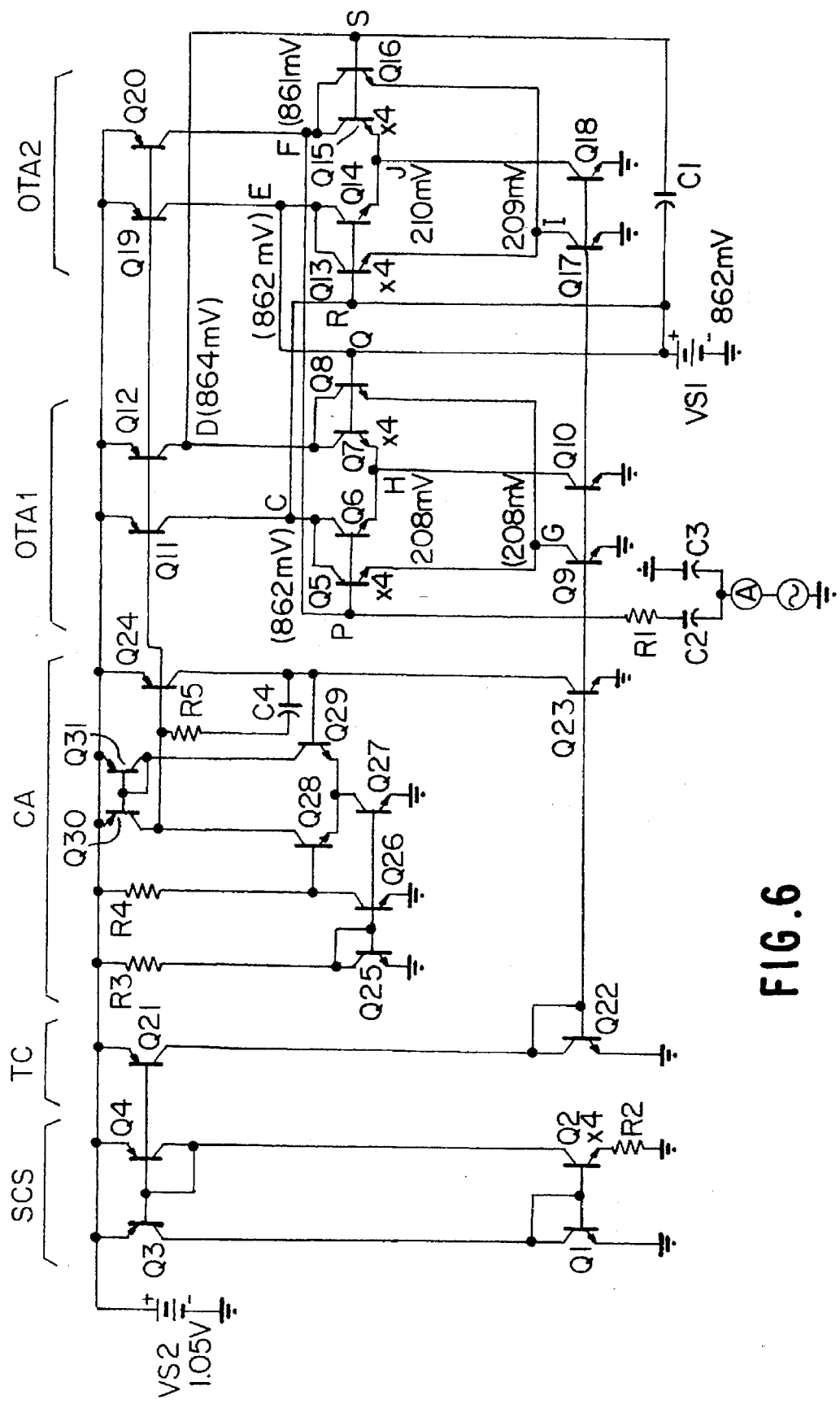
FIG. 6 is a circuit diagram of the LC resonance circuit utilizing the gyrator circuit according to the present invention.

FIG. 6 is a circuit diagram of the LC resonance circuit utilizing the gyrator circuit according to the present invention. In the figure, the same parts as those shown in FIG. 4 are denoted by the same reference numbers.

Figure 1:
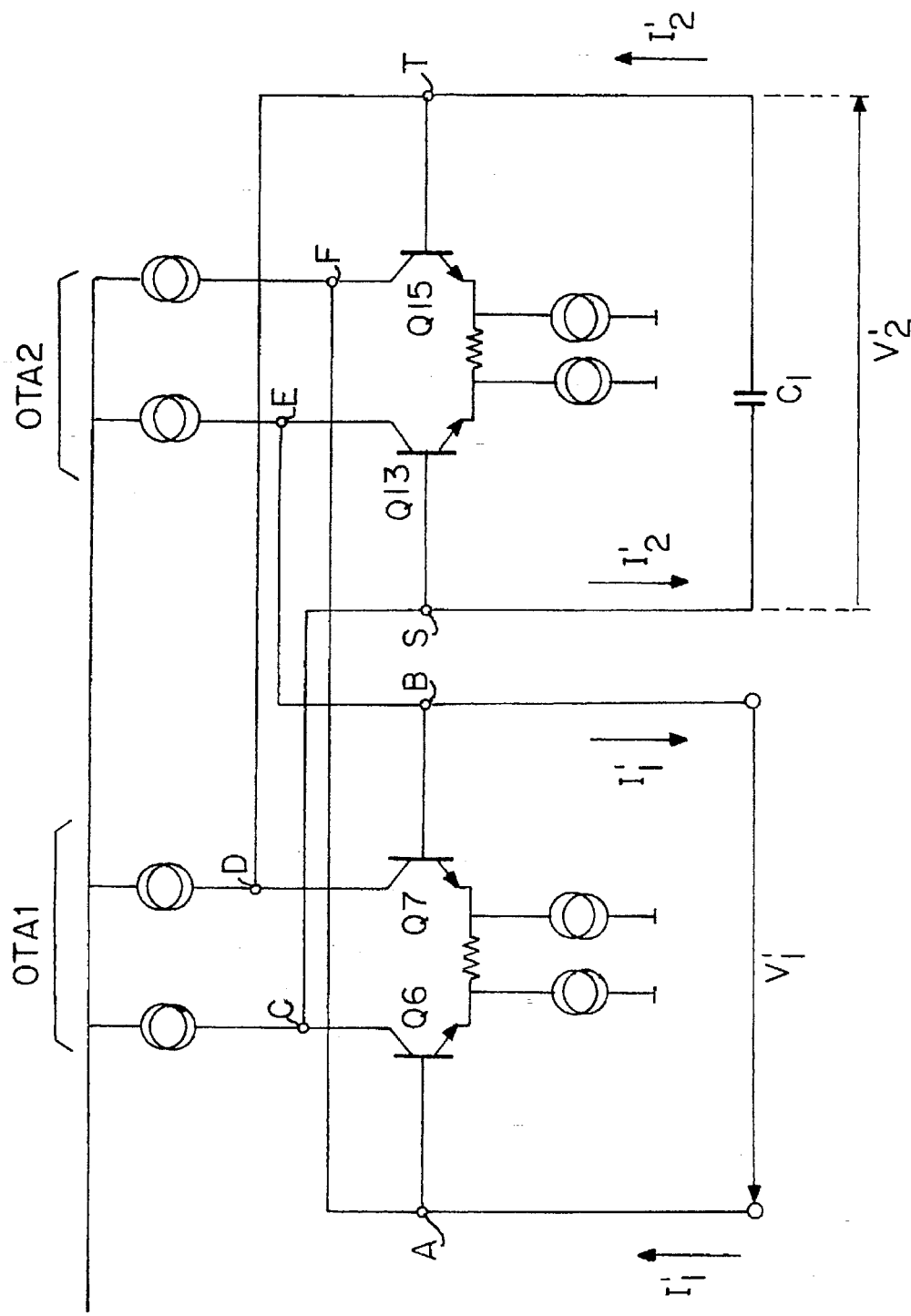
FIG. 1 represents a circuit diagram to illustrate the principle of a conventional gyrator circuit.
Figure 2:
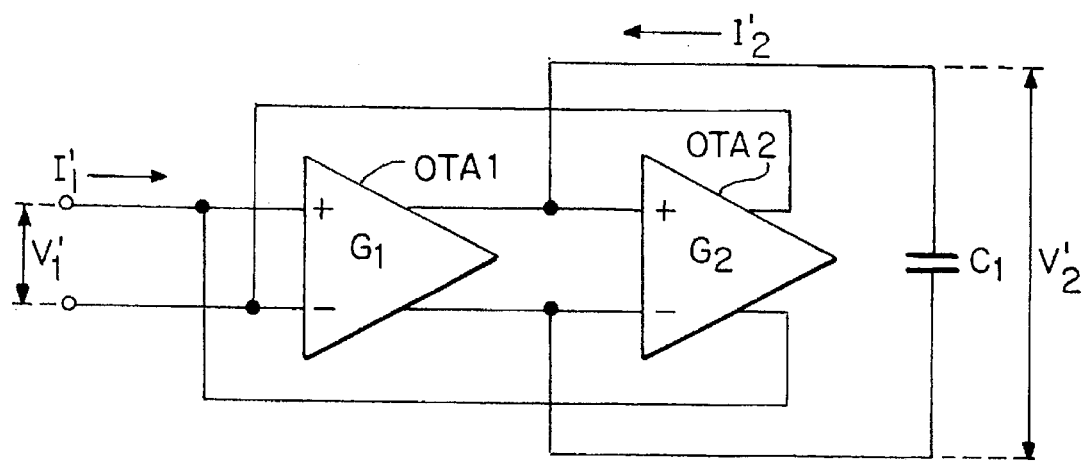
FIG. 2 is a block diagram of an ac-equivalent circuit of the gyrator circuit shown in FIG. 1.
Figure 3:
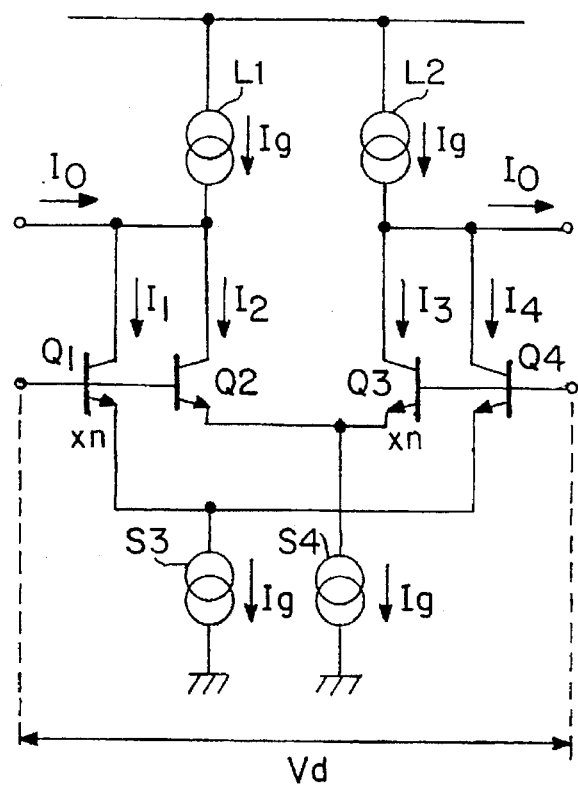
FIG. 3 is a circuit diagram of an OTA practically used in a gyrator circuit.
Figure 4:
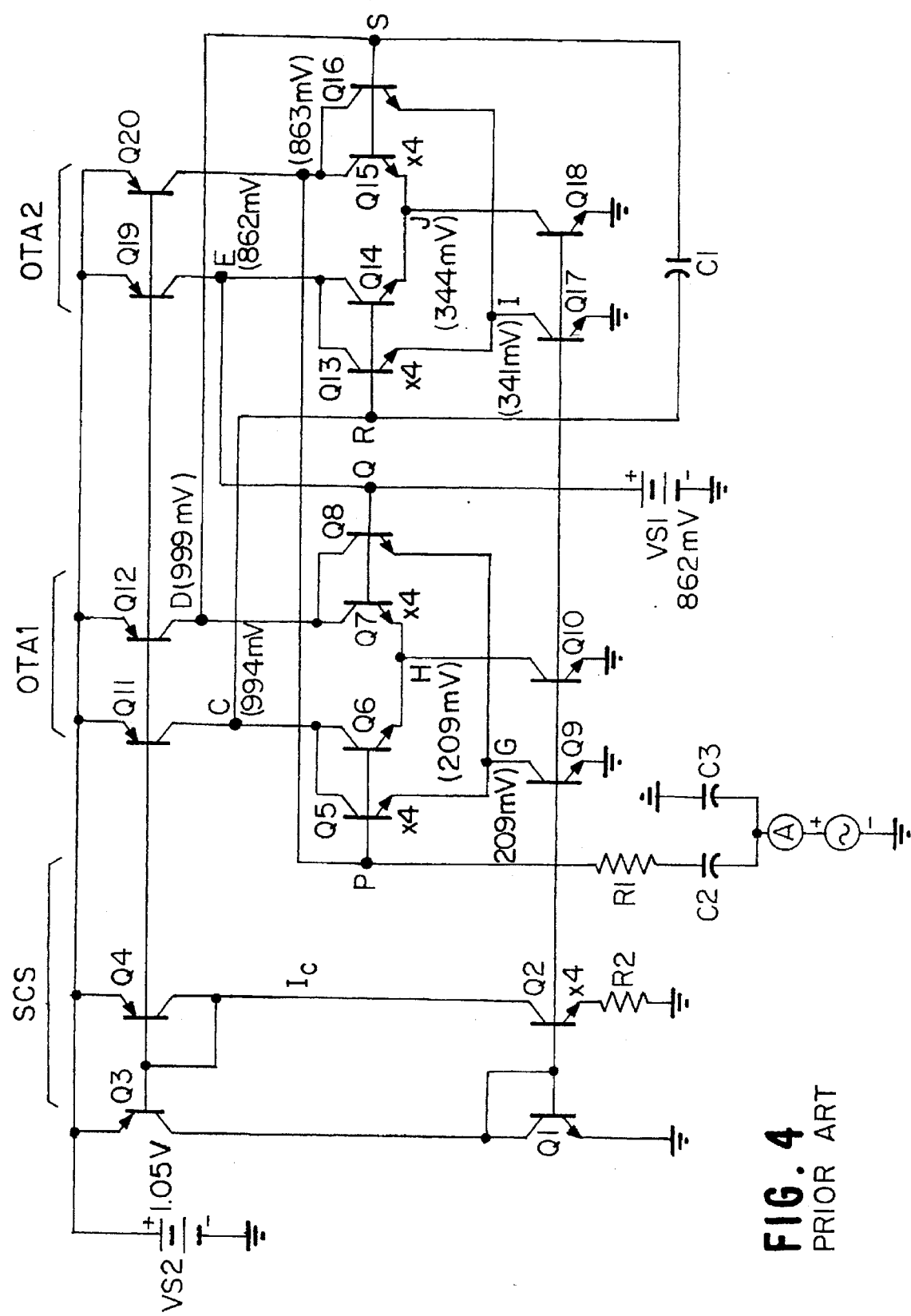
FIG. 4 is a circuit diagram of a resonance circuit utilizing the gyrator circuit made up of OTAs as shown in FIG. 3.
Figure 5:
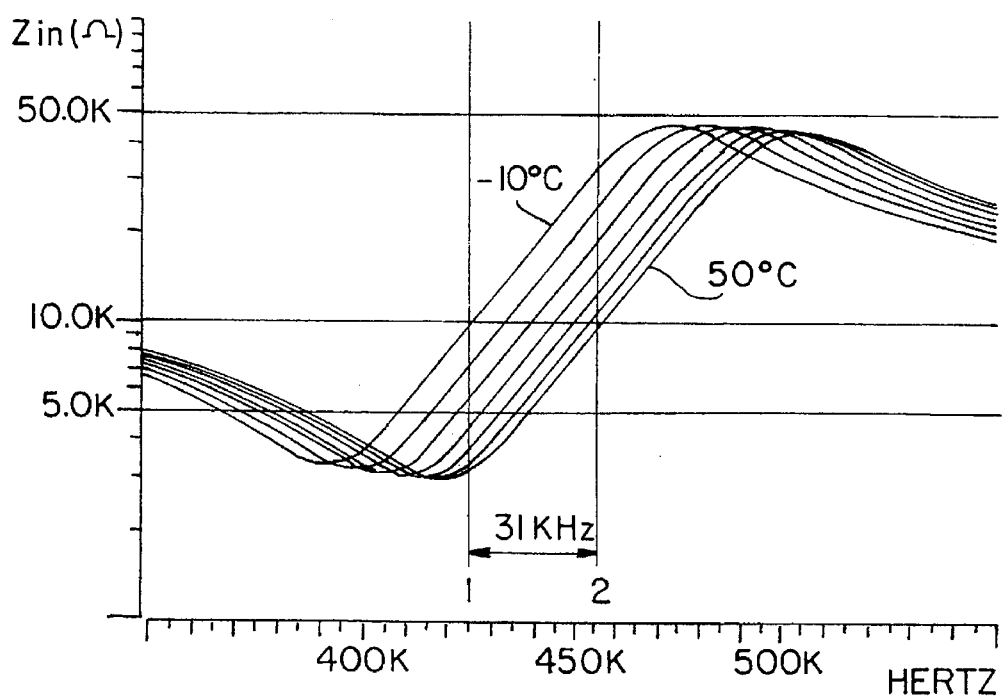
FIG. 5 represents a temperature dependence of the input impedance of the gyrator circuit shown in FIG. 4 plotted against frequency.

The gyrator circuit according to the present invention differs from the gyrator circuit of prior art shown in FIG. 4 basically in that the second input terminal Q of OTA 1 and the first input terminal R of OTA 2 are biased at the same dc voltage VS1 with respect to the ground potential, and that the stabilized current supply SCS supplies a stabilized current through transfer circuit TC.

These features are essentially important to stabilize the equivalent inductance of the gyrator circuit against a temperature variation.

In the present embodiment, both of the terminals Q, R are biased at 862 mV allowing for the operating voltage 1.05 V of the voltage source VS2. This biasing in turn causes the first output terminals C, E of OTA 1 and OTA 2 to be placed at the same potential VS1. Since one input terminal of OTA 1 is biased at the same potential as that of OTA 2 and since one output terminal of OTA 1 is applied with the same potential as that of OTA 2, the two OTAs have the same transconductance characteristic.

As a result, the operation in a saturated state in one of the OTAs due to off-balanced biasing can be avoided.

Furthermore, since the two OTAs are biased at the same dc voltages as described above, carriers to be supplied to the emitters of all of the current-source transistors Q 9, Q 10, Q 17 and Q 18 can be controlled at the same time by a single base bias supplied from stabilized current supply SCS via transfer circuit TC which will be explained below.

The circuitry and operation of the stabilized current supply SCS are similar to those of the stabilized current supply SCS shown in FIG. 4 except the fact that the stabilized current supply of FIG. 4 supplies a base bias to the OTA 1 and OTA 2 having different characteristics.

The transfer circuit is made up of an NPN transistor Q22 and a PNP transistor Q21 serially connected to each other. Transistor Q22 is diode-connected, the base of which is connected to the base line of the current-source transistors of the operational transconductance amplifiers. The base of transistor Q21 is connected to the bases of transistor Q3, Q4 to form a current mirror circuit.

In operation of transfer circuit TC, the corrector current of transistors Q4, Q2 is transferred to transfer circuit TC via the current mirror circuit made up of transistors Q2, Q4 and Q21. The corrector current of Q21, Q22 is transferred to OTA 1 and OTA 2 via the current mirror circuit made up of transistors Q21, Q22 and the base line of the current-source transistors of OTA 1 and OTA 2.

The advantage of providing the transfer circuit is that it prevents the base current of transistor Q2 to flow to the base line of the current-source transistors. If the base current of transistor Q2 flows out to the base line, the loss of the base current will cause a control error in stabilized current supply SCS.

The gyrator circuit of the present embodiment has a current amplifier circuit to stabilize the currents which flow through load transistors Q11, Q12, Q19 and Q20.

The current amplifier circuit CA comprises: current source circuit made up of NPN transistors Q25, Q26 and resistors R3, R4; differential amplifier made up of NPN transistors Q28, Q29, Q27, and PNP transistors Q30, Q31; and output buffer circuit made up of an NPN transistor Q23, a PNP transistor Q24, and a feedback path made up of resistor R5 and capacitor C4.

Transistor Q25 is diode-connected the base of which is connected to the base of transistor Q26. The current produced in the transistor Q25 is transferred to the current-source transistor Q27 of the differential amplifier via the current mirror circuit made up of resistor R3, transistor Q25 and transistor Q26.

The output terminal of the current mirror circuit (the potential at the junction of resistor R4 and the collector of transistor Q26) is supplied to the base of one (Q28) of the differential gain transistors. The base of the other (Q29) of the differential gain transistors is connected with the output terminal of the output buffer circuit (the junction of the collectors of transistors Q23 and Q24). Transistors Q30, Q31 act as the load transistors of the differential amplifier. One of the differential output terminals (the junction of transistors Q28 and Q30) is connected to the base of transistor Q24 and the base line which connects the bases of the load transistors Q11, Q12, Q19 and Q20 of OTA1 and OTA2.

Since negative feedback is effected through the signal path connecting between the base of transistor Q29 and the junction of the collectors of transistors Q23 and Q24, the potential to be applied to the base line of the load transistors Q11, Q12, Q19 and Q20 is stabilized, whereby the stabilized currents are supplied to the load transistors Q11, Q12, Q19 and Q20 by means of a current mirror circuit.

Furthermore, the base of transistor Q23 is connected with the base line which connects the base of transistor Q22 of transfer circuit TC and the bases of the current-source transistors Q9, Q10, Q17 and Q18 of OTAs in order to ensure the current which each of the current-source transistors Q9, Q10, Q17 and Q18 supplies to the OTA equals the current which flows through each of the load transistors Q11, Q12, Q19 and Q20.

In FIG. 6, main dc biases are entered which are simulated by means of the circuit simulator of Spice et al. The simulation was implemented under the following conditions: temperature 25° C.; series resonance frequency 410 KHz; parallel resonance frequency 490 KHz; center frequency 450 KHz; input impedance approximately 12 K$\Omega$ at 450 KHz; tension of dc voltage source VS2 1.05 V; and ac ground potential 860 mV. In addition, the simulation is performed assuming that the temperature characteristics of the dc voltage source VS2 and ac ground potential accord with the temperature characteristic of $V_{BE}$ of employed transistors in order to take the temperature characteristic of the $V_{BE}$ of the transistor out of consideration.

From the result of the simulation above, it is known that the differences of the bias voltages of input and output terminals of the OTAs are as small as 3 mV which is a difference rate of ±0.35% with respect to the ac ground bias VS.

For comparison, in the prior art LC resonance circuit shown in FIG. 4 the differences of the bias voltages of input and output terminals of the OTAs are as large as 137 mV, or 16% expressed by the difference rate. From this result of simulation, it is clear that the circuit of the present invention is significantly stable against temperature variation.

Furthermore, it is known that the phase of the input impedance of the resonance circuit of FIG. 6 is approximately 65 degrees, showing remarkable improvement compared to 37 degree of the prior art resonance circuit.

Figure 7:
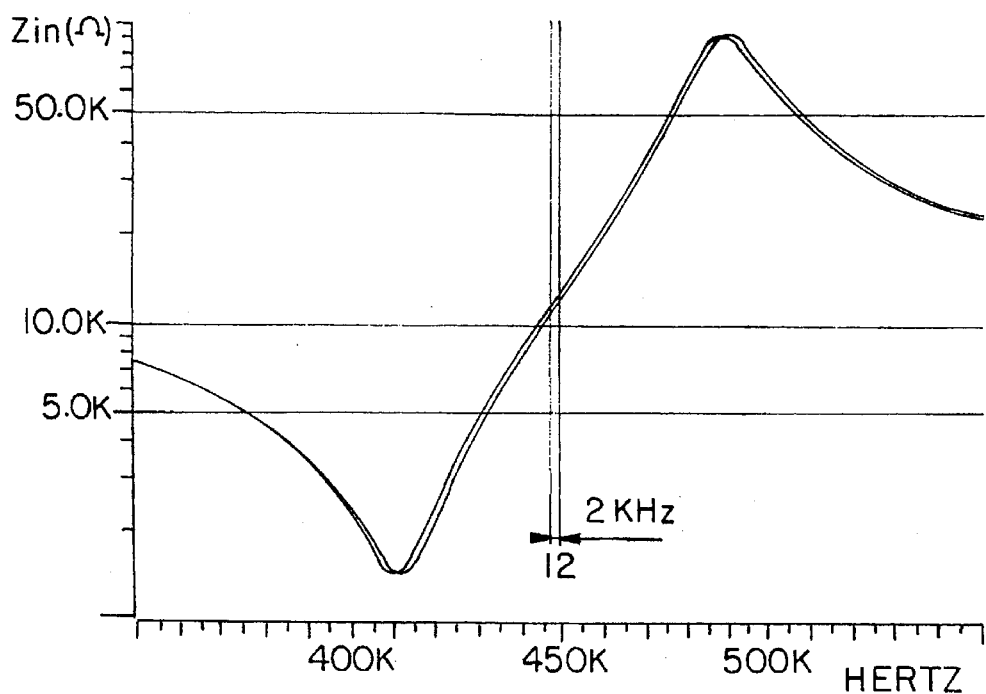
FIG. 7 represents a temperature dependence of the input impedance of the gyrator circuit shown in FIG. 6 plotted against frequency.

FIG. 7 represents a temperature dependence of the input impedance of the gyrator circuit shown in FIG. 6 plotted against frequency.

The figure shows that the temperature variation from −10° C. to 50° C. causes a shift of the impedance characteristic by 2 KHz, i.e., ±1 KHz with respect to the center frequency of 450 KHz. For comparison, in the prior art LC resonance circuit utilizing the gyrator circuit shown in FIG. 4, the shift of the input impedance characteristic was 30 KHz, i.e., ±15 KHz.

Accordingly, it is known from FIG. 7 that the resonance frequency of the LC resonance circuit of the present invention will be little influenced by temperature variation, exhibiting a quite stable characteristic.

Since the frequency variation versus temperature variation of an ordinary resonance circuit in which a ceramic element is employed as a capacitor element is approximately ±1.5 KHz for the above-described range of temperature variation, there is no problem practically to use the LC resonance circuit according to the present invention.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A grounded inductance circuit utilizing a gyrator circuit, including
   a first operational transconductance amplifier, a second operational transconductance amplifier, and a first capacitor,
   a first output terminal of said first operational transconductance amplifier being connected to a first input terminal of said second operational transconductance amplifier,
   a second output terminal of said first operational transconductance amplifier being connected to a second input terminal of said second operational transconductance amplifier,
   a first output terminal of said second operational transconductance amplifier being connected to a second input terminal of said first operational transconductance amplifier,
   a second output terminal of said second operational transconductance amplifier being connected to a first input terminal of said first operational transconductance amplifier,
   said second input terminal of said first operational transconductance amplifier and said first input terminal of said second operational transconductance amplifier being connected to each other, and the junction of the two input terminals being applied with a predetermined dc bias voltage with respect to the ground potential,
   said first capacitor being connected between said junction and said second input terminal of said second operational transconductance amplifier, and
   an ac signal source being applied between said first input terminal of said first operational transconductance amplifier and the ground potential.

2. A grounded inductance circuit as claimed in claim 1, wherein
   each of the operational transconductance amplifiers has at least one differential amplifier with gain transistors of a first conduction type the emitters of which are connected together to a collector of a current-source transistor of the first conduction type, the collectors of said gain transistors being connected to individual load transistors of a second conduction type,
   said grounded inductance circuit further includes: a stabilized current supply for providing a constant current to the current-source transistors of said operational transconductance amplifiers; a transfer circuit for transferring said constant current provided by said stabilized current supply to said current-source transistors of said operational transconductance amplifiers through a current mirror circuit,
   said stabilized current supply comprising; a first transistor of said first conduction type and a second transistor of the second conduction type serially connected to said first transistor; and a third transistor of said first conduction type and a fourth transistor of said second conduction type serially connected to said third transistor, the emitter of said third transistor being connected to one end of a current-regulating resistor, the resistance of the resistor being determined so that an arbitrarily selected one of the operational transconductance amplifiers has an optimum transconductance for realizing an intended inductance of the gyrator circuit; and
   said transfer circuit comprising a fifth transistor of said first conduction type and sixth transistor of said second conduction type serially connected to said fifth transistor, wherein said first transistor is diode-connected, the base of the diode-connected first transistor being connected to the base of said third transistor; said fourth transistor is diode-connected, the base of the diode-connected fourth transistor being connected to the base of said second transistor; the base of the sixth transistor is connected to the base of said fourth transistor; said fifth transistor is diode-connected, the base of the fifth transistor being connected to the bases of said current-source transistors of said operational transconductance amplifiers; and the emitters of said first, fifth transistors and the other end of said resistor are connected to the grounded electrode of an operating dc voltage source and emitters of said second, fourth and sixth transistors are connected to the other electrode of said operating dc voltage source.

3. An LC resonance circuit, comprising the gyrator circuit according to claim 1, and a second capacitor connected in parallel to said ac signal source with one output terminal of said second capacitor being grounded.

4. An LC resonance circuit, comprising the gyrator circuit according to claim 1, and a third capacitor connected in series to said ac signal source with one output terminal of said third capacitor being connected to the first input terminal of the first operational transconductance amplifier.

* * * * *